(12) United States Patent
Fan

(10) Patent No.: US 10,088,132 B2
(45) Date of Patent: Oct. 2, 2018

(54) QUANTUM DOT LIGHT SOURCE AND QUANTUM DOT BACKLIGHT MODULE

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 193 days.

(21) Appl. No.: 15/038,621

(22) PCT Filed: Apr. 25, 2016

(86) PCT No.: PCT/CN2016/080153
§ 371 (c)(1),
(2) Date: May 23, 2016

(87) PCT Pub. No.: WO2017/173681
PCT Pub. Date: Oct. 12, 2017

(65) Prior Publication Data
US 2018/0080638 A1    Mar. 22, 2018

(30) Foreign Application Priority Data
Apr. 7, 2016   (CN) .......................... 2016 1 0213386

(51) Int. Cl.
*F21V 19/00* (2006.01)
*F21V 8/00* (2006.01)
(Continued)

(52) U.S. Cl.
CPC ............ *F21V 19/0015* (2013.01); *F21V 9/16* (2013.01); *F21V 9/30* (2018.02); *G02B 6/009* (2013.01);
(Continued)

(58) Field of Classification Search
CPC ........ F21V 19/0015; F21V 9/16; F21V 29/10; G02B 6/0023; G02B 6/0073; G02B 6/009;
(Continued)

(56) References Cited

U.S. PATENT DOCUMENTS 8,508,126 B1 *  8/2013  Morejon .................. F21V 9/16
                                                               313/46
8,622,600 B2    1/2014  Cheng et al.
(Continued)

FOREIGN PATENT DOCUMENTS

CN      102386318 A     3/2012
CN      104421768 A     3/2015
(Continued)

*Primary Examiner* — Bao Q Truong
(74) *Attorney, Agent, or Firm* — Andrew C. Cheng

(57) ABSTRACT

A quantum dot light source and a quantum dot backlight module are disclosed. The quantum dot light source includes a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board, and a quantum dot film covering on the receiving chambers of the circuit board. The manufacturing cost of the quantum dot light source of the present invention is lower, and the light-emitting quality is stable.

10 Claims, 1 Drawing Sheet

(51) Int. Cl.
*F21V 9/16* (2006.01)
*F21V 9/30* (2018.01)
*F21V 29/10* (2015.01)
*H01L 33/48* (2010.01)
*H01L 33/62* (2010.01)
*F21Y 103/10* (2016.01)
*F21Y 115/10* (2016.01)
*H01L 25/075* (2006.01)

(52) U.S. Cl.
CPC ......... *G02B 6/0023* (2013.01); *G02B 6/0073* (2013.01); *F21V 29/10* (2015.01); *F21Y 2103/10* (2016.08); *F21Y 2115/10* (2016.08); *H01L 25/0753* (2013.01); *H01L 33/486* (2013.01); *H01L 33/62* (2013.01)

(58) Field of Classification Search
CPC ............. F21Y 2103/10; F21Y 2115/10; H01L 25/0753; H01L 33/486; H01L 33/62; H01L 25/115
See application file for complete search history.

(56) References Cited

U.S. PATENT DOCUMENTS

| | | | |
|---|---|---|---|
| 9,753,214 B2* | 9/2017 | Shin | G02B 6/0073 |
| 2007/0138488 A1* | 6/2007 | Tasch | H01L 33/64 |
| | | | 257/88 |
| 2010/0103648 A1* | 4/2010 | Kim | H01L 33/507 |
| | | | 362/97.1 |
| 2013/0015478 A1* | 1/2013 | Oh | H05K 1/05 |
| | | | 257/98 |
| 2013/0032828 A1* | 2/2013 | Hsu | H01L 24/32 |
| | | | 257/88 |
| 2013/0033885 A1* | 2/2013 | Oh | F21V 3/02 |
| | | | 362/516 |
| 2016/0033715 A1 | 2/2016 | Lee et al. | |
| 2016/0116121 A1 | 4/2016 | Hu et al. | |
| 2017/0219763 A1 | 8/2017 | Goeoetz et al. | |

FOREIGN PATENT DOCUMENTS

| | | |
|---|---|---|
| CN | 105319773 A | 2/2016 |
| CN | 105372878 A | 3/2016 |
| JP | 2007036044 A | 2/2007 |

* cited by examiner

QUANTUM DOT LIGHT SOURCE AND QUANTUM DOT BACKLIGHT MODULE

BACKGROUND OF THE INVENTION

1. Field of the Invention

The present invention relates to a display panel field, and more particularly to a quantum dot light source and a quantum dot backlight module.

2. Description of Related Art

For a traditional liquid crystal display panel, the display panel does not emit light itself and requiring an external light source to perform a display. Generally, the external light source includes a backlight light source and a reflective light source. The backlight light source can actively emit light and does not affect by an environment change. Therefore, the backlight light source is usually adopted currently.

Because the light emitting diode (LED) consumes lower power, generates less heat and has a long life, the LED is usually applied in the backlight light source. The current LED widely adopts luminescent material as phosphors. However, the light decay of the phosphors is large, the uniformity of the particles is poor and the performance of the color of the emitted light is not enough.

Currently, a quantum dot light source is usually adopted. A quantum dot can emit fluorescence under the excitation of the light. Besides, the quantum dots having different sizes can generate light with different frequencies after excited. However, the quantum dot is easily to fail under the affection of high temperature and oxygen. Therefore, current backlight module does not find a suitable way to dispose the quantum dot. The manufacturing cost of the current quantum dot light source is higher.

SUMMARY OF THE INVENTION

The present invention mainly solves the problem that the quantum dot light source in the conventional art is higher.

In order to solve the above technology problem, the present invention provides a quantum dot light source, comprising: a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board; a quantum dot film covering on the receiving chambers of the circuit board; wherein the circuit board includes a metal substrate, an insulation layer and a copper layer, the receiving chambers are disposed on the metal substrate, the insulation layer is disposed at a bottom surface of receiving chambers, the copper layer is disposed on the insulation layer, and the light-emitting diodes are disposed on the copper layer and are electrically connected to the copper layer; and wherein the quantum dot film includes a quantum dot layer and an isolation layer which surrounds the quantum dot layer.

Wherein, a bonding layer is provided at the outer side surface which is concave and is provided with the receiving chambers in order to bond the quantum dot film In order to solve the above technology problem, the present invention further provides a quantum dot light source, comprising: a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board; and a quantum dot film covering on the receiving chambers of the circuit board.

Wherein, the circuit board includes a metal substrate, an insulation layer and a copper layer, the receiving chambers are disposed on the metal substrate, the insulation layer is disposed at a bottom surface of receiving chambers, the copper layer is disposed on the insulation layer, and the light-emitting diodes are disposed on the copper layer and are electrically connected to the copper layer.

Wherein, a bonding layer is provided at the outer side surface which is concave and is provided with the receiving chambers in order to bond the quantum dot film Wherein, the metal substrate is an aluminum plate.

Wherein, the quantum dot film includes a quantum dot layer and an isolation layer which surrounds the quantum dot layer.

Wherein, the isolation layer includes a lower isolation layer which locates between the quantum dot layer and the circuit board, and an upper isolation layer opposite to the lower isolation layer.

Wherein, each of the light-emitting diodes is a blue light-emitting diode.

Wherein, each of the receiving chambers is installed with two of the light-emitting diodes.

Wherein, each light-emitting diode does not exceed the outer side surface of the circuit board, and a distance in a vertical direction between each light-emitting diode and the outer side surface is in a range of 2.5 mm~3.5 mm.

In order to solve the above technology problem, the present invention further provides a quantum dot backlight module, wherein the backlight module includes a quantum dot light source and a light guide plate, the quantum dot light source is disposed at a light incident surface of the light guide plate, and the quantum dot light source, comprises: a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board; and a quantum dot film covering on the receiving chambers of the circuit board.

Wherein, the circuit board includes a metal substrate, an insulation layer and a copper layer, the receiving chambers are disposed on the metal substrate, the insulation layer is disposed at a bottom surface of receiving chambers, the copper layer is disposed on the insulation layer, and the light-emitting diodes are disposed on the copper layer and are electrically connected to the copper layer.

Wherein, a bonding layer is provided at the outer side surface which is concave and is provided with the receiving chambers in order to bond the quantum dot film Wherein, the metal substrate is an aluminum plate.

Wherein, the quantum dot film includes a quantum dot layer and an isolation layer which surrounds the quantum dot layer.

Wherein, the isolation layer includes a lower isolation layer which locates between the quantum dot layer and the circuit board, and an upper isolation layer opposite to the lower isolation layer.

Wherein, each of the light-emitting diodes is a blue light-emitting diode.

Wherein, each of the receiving chambers is installed with two of the light-emitting diodes.

Wherein, each light-emitting diode does not exceed the outer side surface of the circuit board, and a distance in a vertical direction between each light-emitting diode and the outer side surface is in a range of 2.5 mm~3.5 mm.

The quantum dot light source of the present invention includes a light strip and a quantum dot film, the light strip includes a circuit board and multiple light-emitting diodes. An outer side surface of the circuit board is concave to provide multiple receiving chambers. The receiving chambers are used to install the light-emitting diodes and the light-emitting diodes do not exceed the outer side surface of the circuit board. The quantum dot film covers on the receiving chambers of the circuit board. The present invention is generally applied at a side-light type light source, and only covering a side of the light strip with the quantum dot film The quantum dot film required to be used is less, and the cost is low.

DETAILED DESCRIPTION OF THE PREFERRED EMBODIMENT

Figure 1:
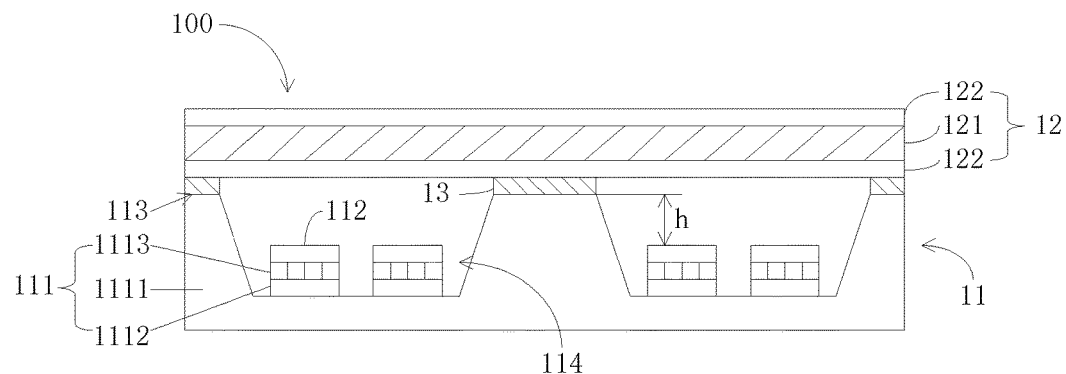
FIG. 1 is a schematic diagram of a quantum dot light source of an embodiment of the present invention.

With reference to FIG. 1, and FIG. 1 is a schematic diagram of a quantum dot light source of an embodiment of the present invention. A quantum dot light source 100 of the present embodiment includes a light strip 11 and a quantum dot film 12.

The quantum dot film 12 includes quantum dots having different sizes, and the quantum dots having different sizes emit light of different colors through excitation of light emitted from the light strip 11. Besides, the color saturation of the light of different colors is high. The quantum dot film formed by quantum dots of RGB three colors can generate light of RGB three colors having high color saturation. When the quantum dot is applied in a liquid crystal panel, the performance of gamut of the liquid crystal panel can be increased. That is the illumination principle of the quantum dot light source 100. Accordingly, the light emitted from the light strip 11 has to irradiate on the quantum dot film 12.

The light strip 11 includes a circuit board 111 and a light-emitting diode 112. The light-emitting diode 112 is electrically connected to the circuit board 111. The light emitting diode 112 can emit light by obtaining electrical energy from the circuit board 111. For exciting the quantum dot film 12 to emit light, the light-emitting diode 112 usually adopts a blue light-emitting diode.

For the circuit board 111, an outer side surface 113 of the circuit board 111 is concave to form multiple receiving chambers 114. The light-emitting diode 112 is installed in the receiving chambers 114 and does not exceed the outer side surface 113 of the circuit board 111. Wherein, each of the receiving chambers 114 can be a rectangular groove, a circular groove or other shapes. Generally, a rectangular groove is adopted for beneficial for installation of a circuit and the light-emitting diode 12. Besides, one receiving chamber 114 can dispose two light-emitting diodes 112 or multiple light-emitting diodes 112.

The quantum dot film 12 covers on the receiving chamber 114 of the circuit board 111 such that the light emitted from the light-emitting diode 112 can irradiate on the quantum dot film 12. Besides, in the present embodiment, after the light-emitting diode 112 is disposed in the receiving chamber 114, a vertical distance between a top terminal of the light-emitting diode 112 and the outer side surface 113 is in a range of 2.5 mm~3.5 mm. Generally, 3.5 mm is adopted, that is, a sufficient space is provided between the light-emitting diode 112 and the quantum dot film 12 in order to ensure that the heat generated by the light-emitting diode 112 and the circuit board 111 will not affect the quantum dot film 12 such that the life of the quantum dot film 12 is greatly extended.

In the present embodiment, the circuit board 111 includes a metal substrate 1111, an insulation layer 1112 and a copper layer 1113. The main body of the circuit board 111 is made of the metal substrate 1111, generally, an aluminum plate is adopted. The receiving chamber 114 is disposed on the metal substrate 1111. That is, a side of the metal substrate 1111 is caved inwardly to form the receiving chamber 114. Because the circuit board 111 is mainly used for providing electric energy for the light-emitting diode 112, and the light-emitting diode 112 is installed inside the receiving chamber 114, a bottom surface of the receiving slot 114 is provided with a circuit formed by the copper layer 1113. Between the copper layer 1113 and the metal substrate 1111, the insulation layer 1112 is provided. The light-emitting diode 112 is disposed on the copper layer 1113, and is electrically connected to the copper layer 1113.

Generally, the quantum dot film 12 is a film having a monolithic piece, and the outer side surface 113 is a flat surface. When the quantum dot film 12 covers on the receiving chamber 114, that is, the quantum dot film 12 covers on the outer side surface 113, a bonding layer 13 is provided at the outer side surface 113 which provided with the receiving chamber 114 in order to bond the quantum dot film 12.

The quantum dot film 12 further includes a quantum dot layer 121 and an isolation layer 122 which surrounds the quantum dot layer 121. The isolation layer 122 is used for preventing the quantum dot layer 121 from contacting with oxygen and moisture so as to generate a fail. The isolation layer 122 includes a lower isolation layer which locates between the quantum dot layer 121 and the circuit board 111, and an upper isolation layer opposite to the lower isolation layer. The isolation layer 122 entirely surrounds the quantum dot layer 121 so that except the upper and the lower isolation layers shown in FIG. 1, the periphery of the quantum dot layer 121 is also surrounded by corresponding isolation layer.

Comparing with the conventional art, the quantum dot light source of the present embodiment includes a light strip and a quantum dot film, the light strip includes a circuit board and multiple light-emitting diodes. An outer side surface of the circuit board is concave to provide multiple receiving chambers. The receiving chambers are used to install the light-emitting diodes and the light-emitting diodes do not exceed the outer side surface of the circuit board. The quantum dot film covers on the receiving chambers of the circuit board. The present invention is generally applied at a side-light type light source, and only covering a side of the light strip with the quantum dot film The quantum dot film required to be used is less, and the cost is low.

Figure 2:
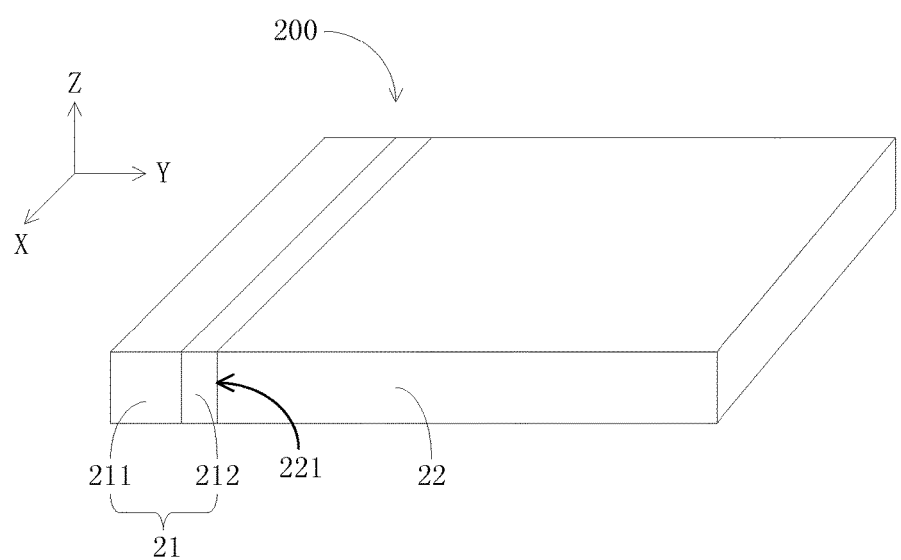
FIG. 2 is a schematic diagram of a quantum dot backlight module of an embodiment of the present invention.

With reference to FIG. 2, and FIG. 2 is a schematic diagram of a quantum dot backlight module of an embodiment of the present invention. A quantum dot backlight module 200 of the present embodiment includes a quantum dot light source 21 and a light guide plate 22. The quantum dot light source 21 is disposed at a light incident surface 221 of the light guide plate 22.

The quantum dot light source 21 includes a light strip 211 and a quantum dot film 212, and the structure of the quantum dot light source 21 is the same as the quantum dot light source 100 as described above, the specific structure is not repeated again. In connection with FIG. 1, it shows that FIG. 1 is a perspective view of FIG. 2 at a Z direction.

Comparing to the conventional art, the quantum dot backlight module of the present embodiment includes a quantum dot light source and a light guide plate. The quantum dot light source is applied at a side-light type light source in order to reduce the manufacturing cost and have a stable light-emitting quality.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A quantum dot light source, comprising:
    a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board; and
    only one quantum dot film covering on the multiple receiving chambers of the circuit board;
    wherein, the circuit board includes a metal substrate, an insulation layer and a copper layer, the receiving chambers are disposed on the metal substrate, the insulation layer is disposed at a bottom surface of receiving chambers, the copper layer is disposed on the insulation layer, and the light-emitting diodes are disposed on the copper layer and are electrically connected to the copper layer;
    wherein the quantum dot film includes a quantum dot layer and an upper isolation layer and a lower isolation layer which surround the quantum dot layer;
    wherein the lower isolation layer is located between the quantum dot layer and the outer side surface of the circuit board, and the upper isolation layer is opposite to the lower isolation layer;
    wherein a bonding layer is provided on the outer side surface, and provided between the outer side surface and the lower isolation layer in order to bond the quantum dot film to the outer side surface of the circuit board; and
    wherein a portion of the bonding layer is disposed between the multiple receiving chambers.

2. The quantum dot light source according to claim 1, wherein, the metal substrate is an aluminum plate.

3. The quantum dot light source according to claim 1, wherein, each of the light-emitting diodes is a blue light-emitting diode.

4. The quantum dot light source according to claim 1, wherein, each of the receiving chambers is installed with two of the multiple light-emitting diodes.

5. The quantum dot light source according to claim 1, wherein, each light-emitting diode does not exceed the outer side surface of the circuit board, and a distance in a vertical direction between each light-emitting diode and the outer side surface is in a range of 2.5 mm~3.5 mm.

6. A quantum dot backlight module, wherein the backlight module includes a quantum dot light source and a light guide plate, the quantum dot light source is disposed at a light incident surface of the light guide plate, and the quantum dot light source, comprises:
    a light strip including a circuit board and multiple light-emitting diodes, wherein an outer side surface of the circuit board is concave to provide multiple receiving chambers, the receiving chambers are used to install the light-emitting diodes, and the light-emitting diodes do not exceed the outer side surface of the circuit board; and
    only one quantum dot film covering on the receiving chambers of the circuit board;
    wherein, the circuit board includes a metal substrate, an insulation layer and a copper layer, the receiving chambers are disposed on the metal substrate, the insulation layer is disposed at a bottom surface of receiving chambers, the copper layer is disposed on the insulation layer, and the light-emitting diodes are disposed on the copper layer and are electrically connected to the copper layer;
    wherein the quantum dot film includes a quantum dot layer and an upper isolation layer and a lower isolation layer which surround the quantum dot layer;
    wherein the lower isolation layer is located between the quantum dot layer and the outer side surface of the circuit board, and the upper isolation layer is opposite to the lower isolation layer;
    wherein a bonding layer is provided on the outer side surface, and provided between the outer side surface and the lower isolation layer in order to bond the quantum dot film to the outer side surface of the circuit board; and
    wherein a portion of the bonding layer is disposed between the multiple receiving chambers.

7. The quantum dot backlight module according to claim 6, wherein, the metal substrate is an aluminum plate.

8. The quantum dot backlight module according to claim 6, wherein, each of the light-emitting diodes is a blue light-emitting diode.

9. The quantum dot backlight module according to claim 6, wherein, each of the receiving chambers is installed with two of the multiple light-emitting diodes.

10. The quantum dot backlight module according to claim 6, wherein, each light-emitting diode does not exceed the outer side surface of the circuit board, and a distance in a vertical direction between each light-emitting diode and the outer side surface is in a range of 2.5 mm~3.5 mm.

* * * * *